(12) United States Patent
Jung

(10) Patent No.: US 7,439,104 B2
(45) Date of Patent: Oct. 21, 2008

(54) SEMICONDUCTOR DEVICE WITH INCREASED CHANNEL LENGTH AND METHOD FOR FABRICATING THE SAME

(75) Inventor: Jin-Ki Jung, Kyoungki-do (KR)

(73) Assignee: Hynix Semiconductor Inc. (KR)

(*) Notice: Subject to any disclaimer, the term of this patent is extended or adjusted under 35 U.S.C. 154(b) by 292 days.

(21) Appl. No.: 11/256,509

(22) Filed: Oct. 21, 2005

(65) Prior Publication Data
US 2006/0138468 A1    Jun. 29, 2006

(30) Foreign Application Priority Data
Dec. 28, 2004    (KR) .................. 10-2004-0114153

(51) Int. Cl.
*H01L 21/335*    (2006.01)
(52) U.S. Cl. ........................ 438/142; 438/177

(58) Field of Classification Search .............. 438/142, 438/177
See application file for complete search history.

(56) References Cited

U.S. PATENT DOCUMENTS
6,579,768 B2 *    6/2003    Thwaite et al. ............ 438/296

FOREIGN PATENT DOCUMENTS

| | | |
|---|---|---|
| JP | 4-212466 | 8/1992 |
| JP | 10-261795 | 9/1998 |
| JP | 2000-269237 | 9/2000 |
| KR | 1999-006027 | 1/1999 |
| KR | 2003-65631 | 8/2003 |

* cited by examiner

*Primary Examiner*—Douglas M Menz
(74) *Attorney, Agent, or Firm*—Blakely, Sokoloff, Taylor & Zafman

(57) ABSTRACT

A semiconductor device with an increased channel length and a method for fabricating the same are provided. The semiconductor device includes: a substrate with an active region including a planar active region and a prominence active region formed on the planar active region; a gate insulation layer formed over the active region; and a gate structure including at least one gate lining layer encompassing the prominence active region on the gate insulation layer.

8 Claims, 6 Drawing Sheets

SEMICONDUCTOR DEVICE WITH INCREASED CHANNEL LENGTH AND METHOD FOR FABRICATING THE SAME

FIELD OF THE INVENTION

The present invention relates to a semiconductor device and a fabrication method thereof; and, more particularly, to a semiconductor device with an increased channel length and a method for fabricating the same.

DESCRIPTION OF RELATED ARTS

In sub-100 nm technology, a generally required channel doping in cell transistors of dynamic random access memories (DRAM) exceeds $10^{18}$ atoms/cm$^3$ and, junction leakage caused by an electric field impedes a data retention/refresh condition. Therefore, instead of forming planar type cell transistors, recessed channels are formed to increase an effective channel length (Leff) and, the channel doping is decreased to $10^{17}$ atoms/cm$^3$ to reduce an electric field. Hence, a recess gate process has been suggested and, many research studies have focused on this process.

FIGS. 1A and 1B are cross-sectional views of a conventional semiconductor device for illustrating a method for fabricating the same. The diagrams in the left side are cross-sectional views in vertical direction to recessed gates of the semiconductor device. The diagrams in the right side are cross-sectional views in horizontal direction to the recessed gates of the semiconductor device.

Referring to FIG. 1A, device isolation regions 12 are formed in predetermined portions of a substrate 11. The device isolation regions 12 are formed in a trench structure and the substrate 11 is based on silicon. Portions of the substrate 11 except for the device isolation regions 12 are active regions 13. A sacrificial oxide layer 14 is formed on the substrate 11 and then, a recess mask 15 based on photoresist is formed on the sacrificial oxide layer 14. Afterwards, the sacrificial oxide layer 14 is etched using the recess mask 15 as an etch barrier and then, a dry etching process is performed on the active regions 13, thereby obtaining a plurality of recessed active regions 16.

The selective dry etching of the active region 13 for forming the recessed active regions 16 is performed at a high density plasma (HDP) apparatus using an inductively coupled plasma (ICP) as a plasma source. Especially, a plasma obtained by mixing Cl$_2$, HBr and O$_2$ gases is used to round a bottom surface of the individual recessed region 16. This rounded bottom surface contributes to the decrease of leakage current during device operation.

Referring to FIG. 1B, the recess mask 15 and the sacrificial oxide layer 14 are sequentially removed and then, a gate insulation layer 17 is grown over the recessed active regions 16. Then, a plurality of recess gate structures 100 are formed. Each of the recess gate structures 100 includes a patterned polysilicon layer 18, a patterned tungsten silicide layer 19 and a gate hard mask 20.

In more detail, although not illustrated, a polysilicon layer, tungsten silicide layer and a gate hard mask layer are formed over the gate insulation layer 17. The gate hard mask layer is formed by using silicon nitride. A selective dry etching process is performed on the gate hard mask layer using a gate mask based on a photosensitive material as an etch barrier, thereby providing the gate hard mask 20. The gate mask is removed thereafter. The selective dry etching process is then performed on the tungsten silicide layer and the polysilicon layer using the gate hard mask 20 as an etch barrier, thereby providing the patterned polysilicon layer 18 and the patterned tungsten silicide layer 19.

As shown, the recess gate structures 100 are partially filled into the respective recessed active regions 16 and partially projected upwardly from a surface of the substrate 11. Therefore, the effective channel length (Leff) below the individual recess gate structure 100 increases.

However, there may be a disadvantage that a horn 16A (refer to FIG. 1A) is generated during the formation of the recessed active regions 16. The etch recipe for forming the recessed active regions 16, i.e., the use of the plasma including the mixture of Cl$_2$, HBr and O$_2$ gases at the HDP apparatus, makes it possible to obtain rounded bottom surfaces of the recessed active regions 16. However, at the edges of the recessed active regions 16 adjacent to the device isolation regions 12, the upper parts of the recessed active regions 16 are shaped like horns because an oxide layer used for forming the device isolation regions 12 functions as an etch barrier, which impairs the complete etching of the recessed active regions 16.

If the horns 16A are not removed, the leakage current may increase during the device operation, thereby degrading a refresh characteristic. For instance, in transistors, the remaining horns 16A may cause an incidence of hump in which a channel is generated at a very low threshold voltage. Despite that the recess gate structure is suggested to improve the refresh characteristic, the remaining horns at the edges of the recessed regions may conversely degrade the refresh characteristic.

SUMMARY OF THE INVENTION

It is, therefore, an object of the present invention to provide a semiconductor device with an increased channel length without employing a recess gate structure and a method for fabricating the same.

In accordance with an aspect of the present invention, there is provided a semiconductor device, including: a substrate with an active region including a planar active region and a prominence active region formed on the planar active region; a gate insulation layer formed over the active region; and a gate structure including at least one gate lining layer encompassing the prominence active region on the gate insulation layer.

In accordance with another aspect of the present invention, there is provided a method for fabricating a semiconductor device, including: preparing a substrate including a planar active region; forming a prominence active region on the planar active region; rounding upper edges of the prominence active region; forming a gate insulation layer over the prominence active region; and forming a gate structure including at lease one gate lining layer encompassing the prominence active region on the gate insulation layer.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

A semiconductor device with an increased channel length and a method for fabricating the same in accordance with embodiments of the present invention will be described in detail with reference to the accompanying drawings.

Figure 1A:
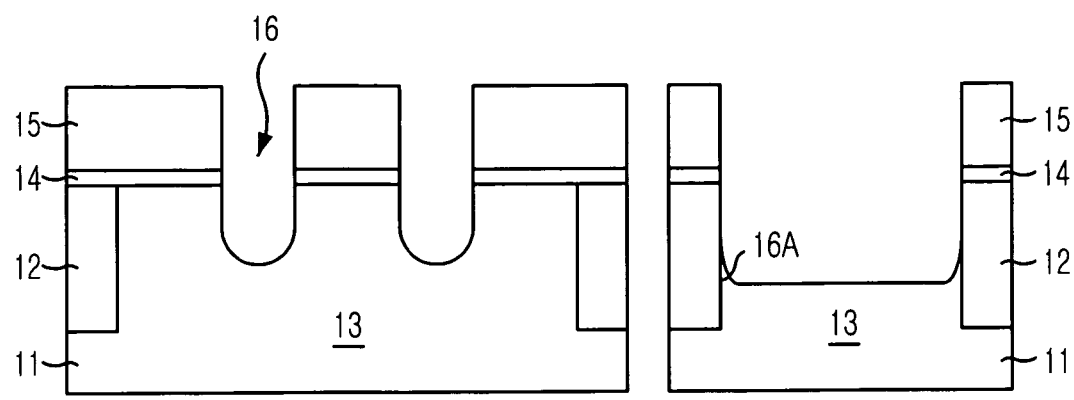
FIGS. 1A and 1B are cross-sectional views illustrating a conventional method for fabricating a semiconductor device with recess gate structures.
Figure 1B:
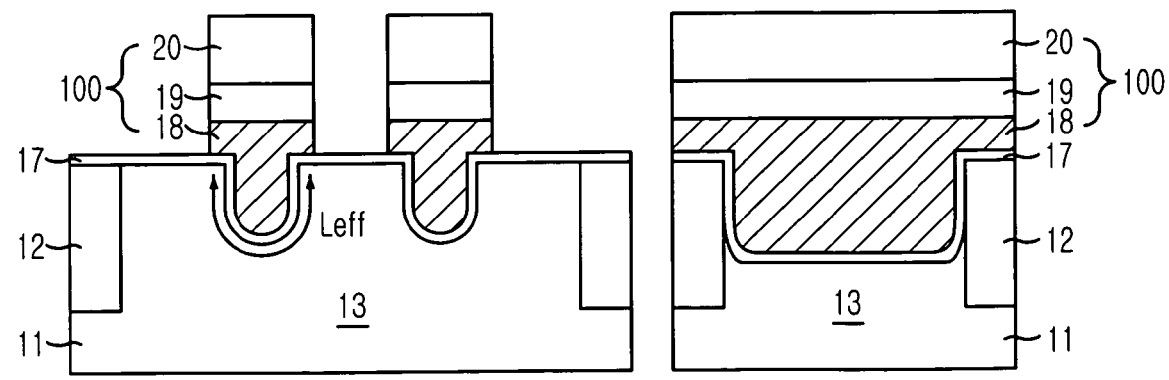
Figure 2:
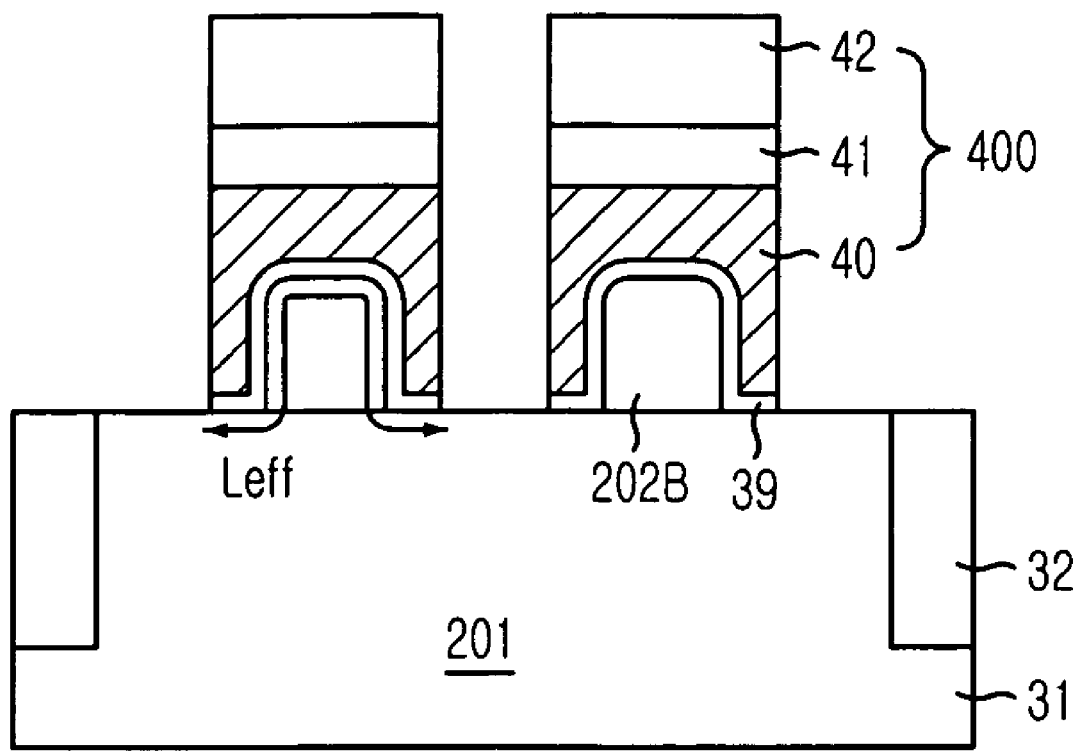
FIG. 2 is a cross-sectional view of a semiconductor device in accordance with a specific embodiment of the present invention.

FIG. 2 is a cross-sectional view of a semiconductor device in accordance with a specific embodiment of the present invention.

The semiconductor device includes: a silicon substrate 31 including a planar active region 201 and a plurality of rounded prominence active regions 202B formed on the planar active region 201; a plurality of device isolation regions 32; a gate insulation layer 39 formed over the rounded prominence active regions 202B; and a plurality of gate structures 400 formed on the gate insulation layer 39 encompassing the rounded prominence active regions 202B.

Each of the gate structures 400 includes: a gate polysiliocn layer 40 formed on the gate insulation layer 39 encompassing both sidewalls and upper part of the individual rounded prominence active region 202B and of which surface is planarized; a gate metal layer 41 formed on the gate polysiliocn layer 40; and a gate hard mask 42 formed on the gate metal layer 41. The gate polysilicon layer 40 and the gate metal layer 41 are gate lining layers.

The rounded prominence active regions 202B are not formed by an etching process but by a selective epitaxial growth (SEG) method. That is, the rounded prominence active regions 202B are silicon epitaxial layers grown on the planar active region 201. The rounded prominence active regions 202B have rounded upper edges.

As described, since the gate structures 400 are formed to cover the rounded prominence active regions 202B, the effective channel length defined below the individual gate structure 400 is longer than that of a planar transistor. Also, since the rounded prominence active regions 202B are formed via SEG method instead of an etching process, it is possible to prevent a horn generation at the edges of the target active regions.

FIGS. 3A to 3G are cross-sectional views illustrating a method for fabricating a semiconductor device in accordance with the specific embodiment of the present invention. Herein, the same reference numerals are used for the same configuration elements described in FIG. 2.

Figure 3A:
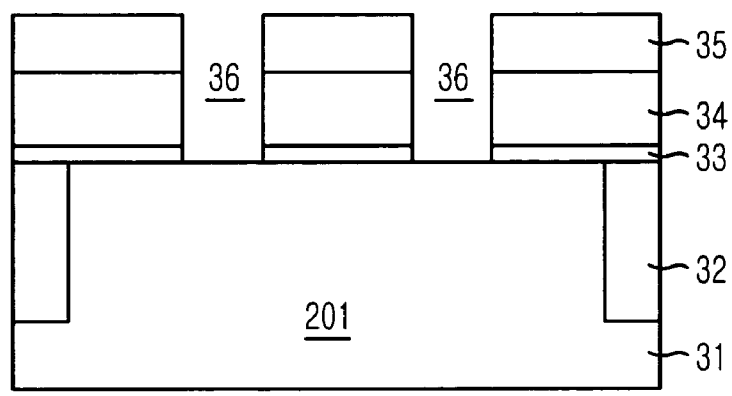
FIGS. 3A to 3G are cross-sectional views of a semiconductor device according to the specific embodiment of the present invention for illustrating a method for fabricating the same.

Referring to FIG. 3A, a shallow trench isolation (STI) process is performed on a substrate 31 to form a plurality of device isolation regions 32. The substrate 31 is based on silicon. A portion of the substrate 31 except for the portions of the substrate 31 where the device isolation regions 32 are formed is defined as an active region, more specifically, a planar active region 201. Although not illustrated, several ion implantation processes and cleaning processes generally required to form cell transistors are performed.

Next, a nitride layer 33 and an oxide layer 34 are formed on the substrate 31 provided with the device isolation regions 32. The nitride layer 33 and the oxide layer 34 are insulation layers for framing epitaxial layers grown via SEG method. The nitride layer 33 has a thickness ranging from approximately 100 Å to approximately 200 Å and, the total thickness of the nitride layer 33 and the oxide layer 34 ranges from approximately 500 Å to approximately 1,000 Å. As the total thickness of the nitride layer 33 and the oxide layer 34 increases, the effective channel length increases as well.

Afterwards, a photosensitive layer is formed on the oxide layer 34 and patterned through a photo-exposure process and a developing process to form a mask pattern 35. The mask pattern 35 has openings each with a critical dimension (CD) identical to that of an opening of a recess mask used for forming recess gate structures. The oxide layer 34 and the nitride layer 33 are sequentially etched using the mask pattern 35 as an etch barrier. From this etching process, a plurality of openings 36 are formed and, expose the substrate 31. Especially, the exposed portions of the substrate 31 are regions where the target gate structures are formed through the SEG method.

Figure 3B:
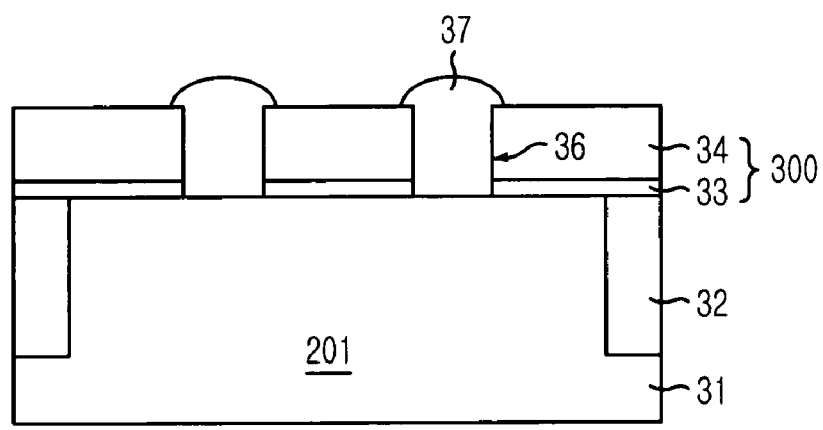

Referring to FIG. 3B, the mask pattern 35 is removed through a strip process, and then, the aforementioned SEG method is carried out to form silicon epitaxial layers 37 on the exposed portions of the substrate 31 using each stack of the nitride layer 33 and the oxide layer 34 as a SEG frame 300. The silicon epitaxial layers 37 are overly grown until filling the openings 36 between the SEG frames 300. Prior to performing the SEG method, a surface of the substrate 31 is cleaned via $NH_3$ plasma cleaning process to remove impurities or remnants such as a native oxide layer and thus to improve characteristics of the silicon epitaxial layers 37.

Figure 3C:
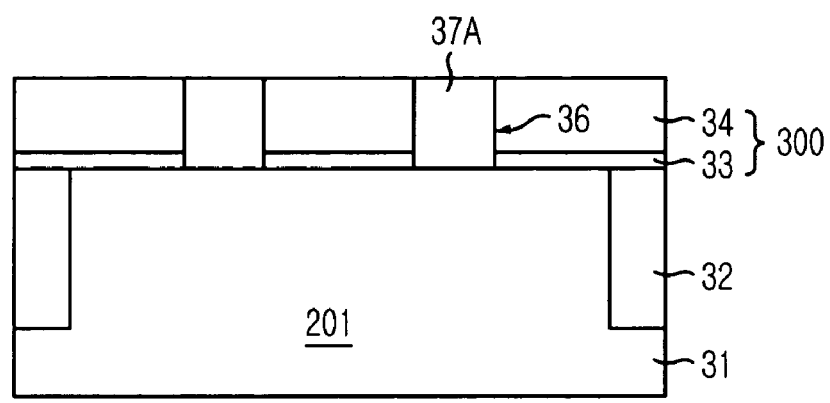

Referring to FIG. 3C, the silicon epitaxial layers 37 are planarized by performing an etch-back process or a chemical mechanical polishing (CMP) process until the oxide layer 34 of the individual SEG frame 300 is exposed. After the etch-back process or the CMP process, planarized silicon epitaxial layers 37A remain inside of the SEG frames 300 and the height of the planarized silicon epitaxial layers 37A is consistent.

Figure 3D:
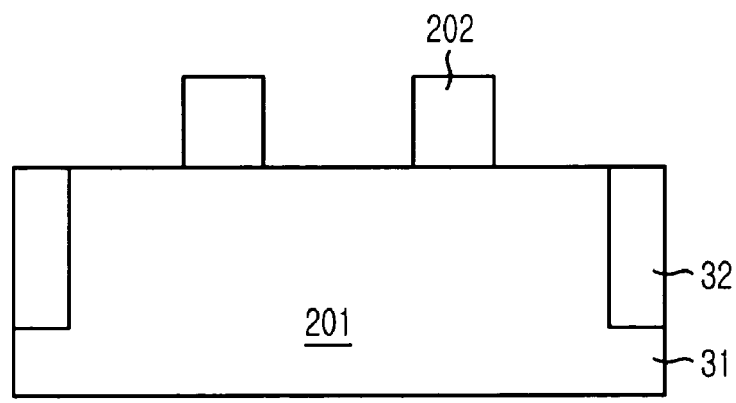

Referring to FIG. 3D, the nitride layer 33 and the oxide layer 34 are sequentially removed by a wet etching process. For instance, the oxide layer 34 is removed by using a solution including fluoric acid (HF), and the nitride layer 33 is removed by using a solution including phosphoric acid ($H_3PO_4$). The nitride layer 33 serves a role in preventing damages on the device isolation regions 32 formed by employing an oxide material during the removal of the oxide layer 34. The planarized silicon epitaxial layers 37A are not damaged by the HF contained solution and the $H_3PO_4$ contained solution due to a specific selectivity of the planarized silicon epitaxial layers 37A to these solutions.

After the removal of the SEG frames 300, the active region includes the planar active region 201 of which surface is planarized and the planarized epitaxial layers 37A protruded upward from the surface of the planar active region 201. The protruded, planarized silicon epitaxial layers 37A are referred to as prominence active regions 202 hereinafter. Each of the prominence active regions 202 has a thickness ranging from approximately 500 Å to approximately 1,000 Å. This thickness is nearly identical to the total thickness of the nitride layer 33 and the oxide layer 34.

Compared with the conventionally formed recessed active regions via etching process, the prominence active regions 202 formed via SEG method are free from an incidence of horn generation as well as have the increased channel lengths.

Figure 3E:
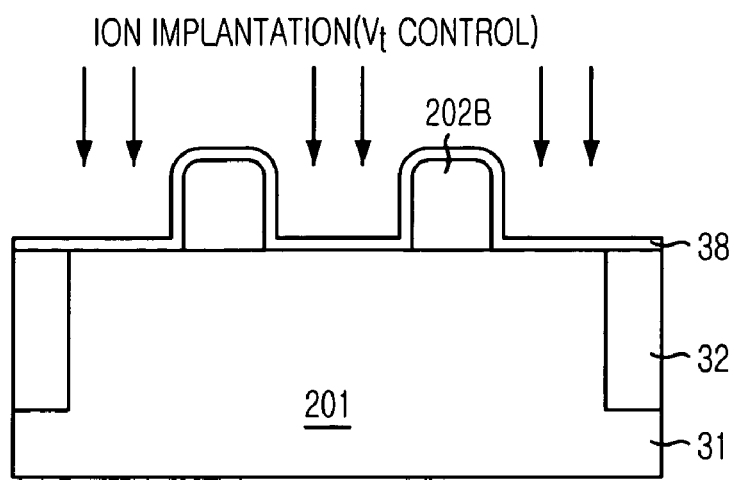

Referring to FIG. 3E, a sacrificial oxide layer 38 is grown on the substrate 31 and the prominence active regions 202. The sacrificial oxide layer 38 is grown by oxidizing surfaces of the prominence active regions 202 and the planar active region 201. Afterwards, an ion implantation process is performed using a predetermined dose to adjust a threshold voltage. When the sacrificial oxide layer 38 is grown, upper edges of the prominence active regions 202 are rounded because silicon is oxidized more actively at the edges of the prominence active regions 202. Especially, a dry oxidation process is employed to grow the sacrificial oxide layer 38. The dry oxidation process is performed at temperature of approximately 800° C. to approximately 1,000° C. Also, the longer the growth time of the sacrificial oxide layer 38, the more the upper edges of the prominence active regions 202 are rounded. In FIG. 3E, a reference numeral 202B denotes the rounded prominence active regions 202.

Figure 3F:
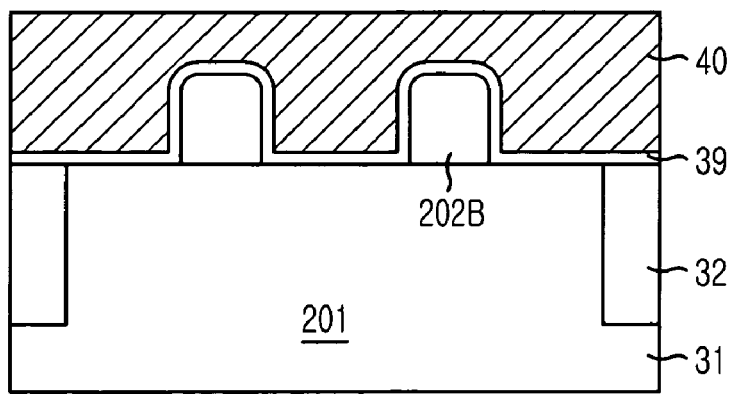

Referring to FIG. 3F, the sacrificial oxide layer 38 is removed and, a gate insulation layer 39 is formed over the rounded prominence active regions 202B. Then, a gate polysilicon layer 40 is formed on the gate insulation layer 39. Since the gate polysilicon layer 40 is formed over a profile of the rounded prominence active regions 202B and the surface of the substrate 31, a surface of the gate polysilicon layer 40 is rough. This surface roughness of the gate polysilicon layer 40 needs to be eliminated to form a gate metal layer uniformly and to perform a gate patterning process more easily. For theses reasons, a CMP process is performed on the gate polysilicon layer 40.

Figure 3G:
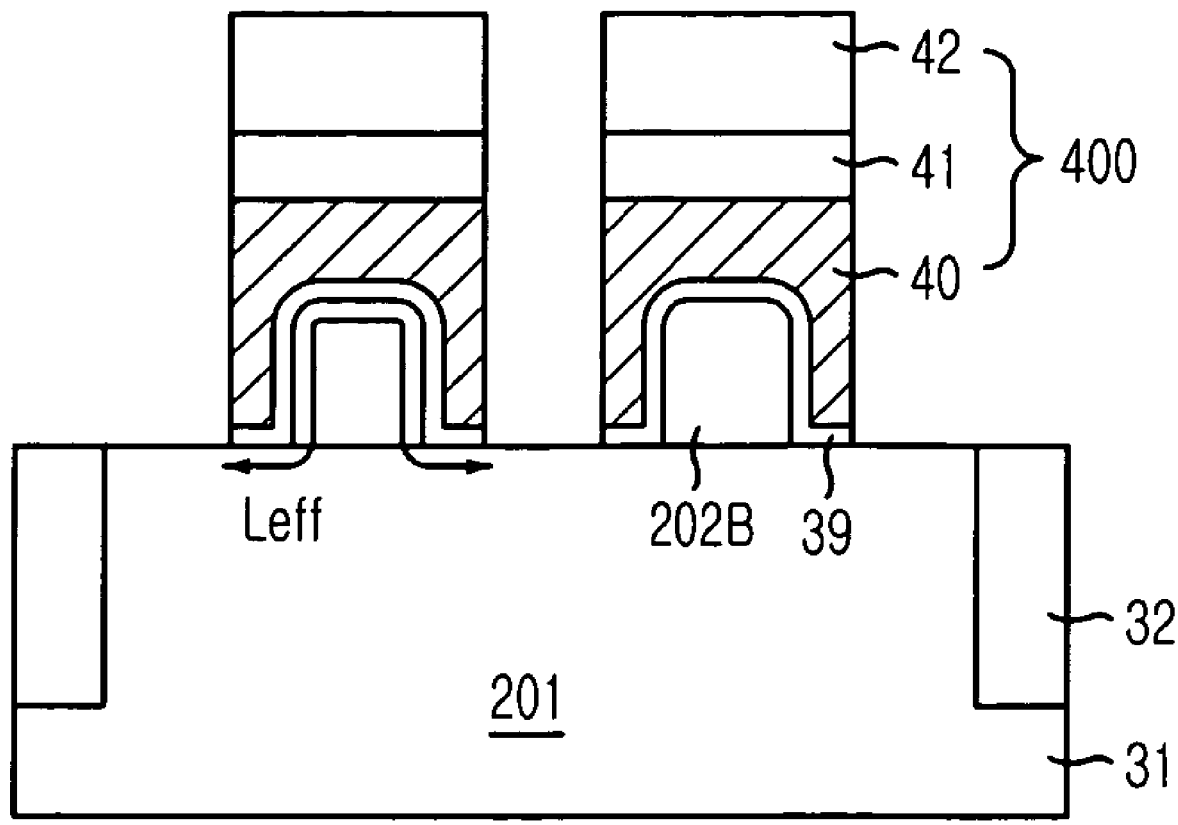

Referring to FIG. 3G, a gate metal layer 41 is formed on the gate polysilicon layer 40. The gate metal layer 41 serves a role in reducing resistance of a gate electrode and, includes tungsten silicide or tungsten. Afterwards, a gate hard mask 42 is formed on the gate metal layer 41. The gate hard mask 42 is formed by using silicon nitride. The gate hard mask 42, the gate metal layer 41 and the gate polysilicon layer 40 are sequentially etched to form a plurality of gate structures 400.

A CD of the individual gate structure 400 is designed to be larger than that of the individual rounded prominence active region 202B to increase the effective channel length (Leff) defined below the individual gate structure 400. More specifically, the gate polysilicon layer 40 is formed to encompass the rounded prominence active regions 202B, thereby increasing the effective channel length. That is, the gate polysilicon layer 40 covers both sidewalls and upper part of the individual rounded prominence active region 202B.

According to the specific embodiment of the present invention, by employing the SEG method for forming the rounded prominence active regions, it is possible to prevent an incidence of horn generation usually occurring when forming recessed active regions via etching process and to increase the effective channel length compared with that of the planar transistor. As a result, it is further possible to increase yields of semiconductor devices.

The present application contains subject matter related to the Korean patent application No. KR 2004-0114153, filed in the Korean Patent Office on Dec. 28, 2004, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising:
    preparing a substrate including a planar active region;
    forming a prominence active region on the planar active region;
    rounding upper edges of the prominence active region;
    forming a gate insulation layer over the prominence active region; and
    forming a gate structure including at lease one gate lining layer encompassing the prominence active region on the gate insulation layer, wherein the forming of the prominence active region is achieved through performing a selective epitaxial growth method.

2. The method of claim 1, wherein the substrate is based on silicon.

3. The method of claim 1, wherein the forming of the prominence active region includes:
    preparing the substrate with the planar active region;
    forming a frame including an opening with a predetermined critical dimension on the planar active region;
    cleaning a surface of the planar active region exposed beneath the opening of the frame;
    growing a silicon epitaxial layer filling the opening of the frame through performing the selective epitaxial growth method;
    planarizing the silicon epitaxial layer to form the prominence active region; and
    selectively removing the frame.

4. The method of claim 3, wherein the frame includes an insulation material.

5. The method of claim 3, wherein the forming of the frame including the opening with the predetermined critical dimension includes:
    sequentially forming a nitride layer and an oxide layer on the planar active region;
    forming a mask pattern on the oxide layer;
    etching the oxide layer and the nitride layer using the mask pattern as an etch barrier; and
    removing the mask pattern.

6. The method of claim 3, wherein the selective removing of the frame employs a wet etching process.

7. The method of claim 3, wherein the cleaning of the surface of the planar active region employs an $NH_3$ plasma cleaning process.

8. The method of claim 3, wherein the planarizing of the silicon epitaxial layer employs one of an etch-back process and a chemical mechanical polishing process.

* * * * *